United States Patent
Homma

(10) Patent No.: US 8,340,946 B2
(45) Date of Patent: Dec. 25, 2012

(54) CIRCUIT DESIGN SUPPORT COMPUTER PRODUCT, APPARATUS, AND METHOD

(75) Inventor: Katsumi Homma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 343 days.

(21) Appl. No.: 12/763,508

(22) Filed: Apr. 20, 2010

(65) Prior Publication Data

US 2010/0292977 A1 Nov. 18, 2010

(30) Foreign Application Priority Data

May 18, 2009 (JP) .................................. 2009-120003

(51) Int. Cl.
*G06F 17/50* (2006.01)
(52) U.S. Cl. ................ 703/2; 703/14; 703/18; 716/114; 716/116; 702/58; 257/43
(58) Field of Classification Search ................ 703/2, 14, 703/18; 716/114–116; 702/58; 257/43
See application file for complete search history.

(56) References Cited

U.S. PATENT DOCUMENTS

| | | | |
|---|---|---|---|
| 2004/0137752 A1* | 7/2004 | Sugamoto et al. | 438/745 |
| 2009/0261325 A1* | 10/2009 | Kawamura et al. | 257/43 |
| 2011/0125480 A1* | 5/2011 | Homma | 703/14 |
| 2011/0276286 A1* | 11/2011 | Homma | 702/58 |

FOREIGN PATENT DOCUMENTS

| | | |
|---|---|---|
| JP | 2003-023078 A | 1/2003 |
| JP | 2005-019524 A | 1/2005 |

* cited by examiner

*Primary Examiner* — Thai Phan
(74) *Attorney, Agent, or Firm* — Fujitsu Patent Center

(57) ABSTRACT

A computer-readable recording medium stores therein a program causing a computer that accesses a simulator to execute receiving a measured yield distribution that expresses an actually measured yield distribution concerning leak current of a circuit-under-design, and model data for leak current of a cell of the circuit-under-design; providing the simulator with the model data and values for a normal distribution concerning variation components of the leak current of the cell; acquiring the leak current of the circuit-under-design; calculating, based on the acquired leak current, an estimated yield distribution concerning the leak current of the circuit-under-design; calculating values for the normal distribution that minimize error between the measured yield distribution and the estimated yield distribution; setting an initial value to the normal distribution and the calculated values for the normal distribution to the normal distribution; and outputting the estimated yield distribution that is based on the leak current of the circuit-under-design.

6 Claims, 10 Drawing Sheets

FIG.3

| CELL ID | CO-EFFICIENT a | CO-EFFICIENT b | CO-EFFICIENT c | CO-EFFICIENT p | CO-EFFICIENT q | CO-EFFICIENT r |
|---|---|---|---|---|---|---|
| C1 | a1 | b1 | c1 | p1 | q1 | r1 |
| C2 | a2 | b2 | c2 | p2 | q2 | r2 |
| ... | ... | ... | ... | ... | ... | ... |
| Ci | ai | bi | ci | pi | qi | ri |
| ... | ... | ... | ... | ... | ... | ... |
| Cn | an | bn | cn | pn | qn | rn |

MODEL DATA TABLE 300

| LEAK CURRENT | ESTIMATED YIELD |
|---|---|
| I(1) | P(1) |
| I(2) | P(2) |
| ⋮ | ⋮ |
| I(j) | P(j) |
| ⋮ | ⋮ |
| I(m) | P(m) |

CIRCUIT DESIGN SUPPORT COMPUTER PRODUCT, APPARATUS, AND METHOD

CROSS REFERENCE TO RELATED APPLICATIONS

This application is based upon and claims the benefit of priority of the prior Japanese Patent Application No. 2009-120003, filed on May 18, 2009, the entire contents of which are incorporated herein by reference.

FIELD

The embodiments discussed herein are related to a computer-readable recording medium storing a design support program; a design support apparatus; and a design support method.

BACKGROUND

Electrical current that is not supposed to flow off in an electronic circuit is called leak current. Leak current increases power consumption and heat in a circuit to become a cause of deterioration of the circuit performance. In light of this, it is important to estimate leak current accurately at circuit design and take a countermeasure.

Due to recent miniaturization of process dimension, the effect of variation caused by the process on the leak current is growing. To deal with this situation, statistical leak analysis that aims to estimate leak current more accurately is known.

Generally, according to the statistical leak analysis, a variation model is created for leak current in cells of a circuit. The variation model is expressed, for example, as an approximation formula having parameters such as gate length, gate width, and threshold voltage ($V_{th}$), which can be causes of the variation. The leak current of a circuit is modeled as the sum of variation models for each cell.

With a general-purpose circuit analysis program such as Simulation Program with Integrated Circuit Emphasis (SPICE), the modeled leak current is analyzed. In this way, a yield distribution for leak current of a circuit is calculated. See, for example, Japanese Laid-Open Patent Publication No. 2005-19524 and Japanese Laid-Open Patent Application Publication No. 2003-23078.

However, it is difficult for the statistical leak analysis to create a variation model taking into account of all causes of the variation arising from the process. Even a SPICE model includes an error. Therefore, according to the conventional statistical leak analysis, there is an error (difference) between a calculated yield distribution of leak current and an actually measured yield distribution of leak current. As a result, forced to return to a previous step in a circuit design, a designer bears more workload, thereby prolonging the design period.

SUMMARY

According to an aspect of an embodiment, a computer-readable recording medium stores therein a program causing a computer that accesses a simulator to execute receiving a measured yield distribution that expresses an actually measured yield distribution concerning leak current of a circuit-under-design, and model data for leak current of a cell of the circuit-under-design; providing the simulator with the model data and values for a normal distribution concerning variation components of the leak current of the cell; acquiring the leak current of the circuit-under-design; calculating, based on the acquired leak current, an estimated yield distribution concerning the leak current of the circuit-under-design; calculating values for the normal distribution that minimize error between the measured yield distribution and the estimated yield distribution; setting an initial value to the normal distribution and the calculated values for the normal distribution to the normal distribution; and outputting the estimated yield distribution that is based on the leak current of the circuit-under-design.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a diagram illustrating one example of the contents of a model data table.

FIG. 6 is a diagram illustrating one example of the contents of an estimated data table.

DESCRIPTION OF EMBODIMENTS

Preferred embodiments of the present invention will be explained with reference to the accompanying drawings.

Figure 1:
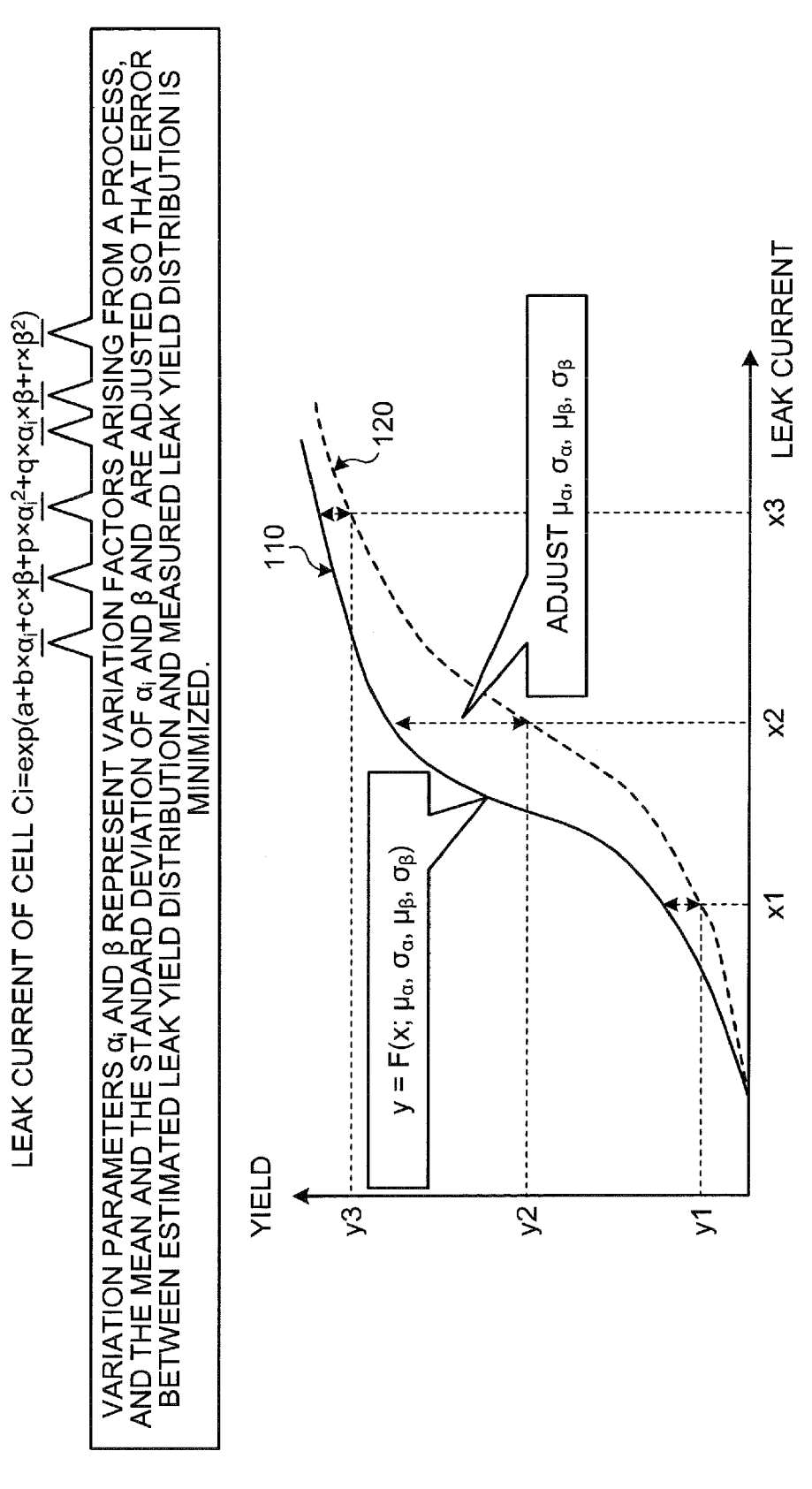
FIG. 1 is a diagram illustrating the design support method according to the first embodiment.

A design support method according to a first embodiment is explained. FIG. 1 is a diagram illustrating the design support method according to the first embodiment.

The design support method improves the accuracy of estimation of a yield distribution regarding leak current of a circuit-under-design. The yield distribution regarding leak current is a probability density distribution according to which a probability for leak current in a circuit to be at most x is y.

When a yield distribution of leak current in a circuit-under-design is estimated in the statistical leak analysis, the sum of leak current in cells of a circuit is given to a simulator as leak current of the entire circuit to calculate a yield distribution of leak current. Hereinafter, a calculated yield distribution of leak current in the circuit-under-design is called "estimated leak yield distribution".

Leak current in a cell is expressed, for example, by equation (1) below. $E_i$ is leak current in a cell $C_i$ (i=1 to n) among cells $C_i$ to $C_n$ of the circuit-under-design. $\alpha_i$ and $\beta$ are variation parameters of the cell $C_i$. a, b, c, p, q, and r are coefficients unique to the cell $C_i$.

$$E_i = \exp(a + b \times \alpha_i + c \times \beta + p \times \alpha_i^2 + q \times \alpha_i \times \beta + r \times \beta^2) \quad (1)$$

In equation (1) above, various variation factors (for example, gate length, gate width, $V_{th}$) arising from the process are expressed by two variation parameters $\alpha_i$ and $\beta$. The variation parameter $\alpha_i$ is a variable representing variation unique to the cell $C_i$. The variation parameter $\beta$ is a variable representing variation common to all cells $C_i$ to $C_n$.

The variation parameter $\alpha_i$ is assumed to follow a standard normal distribution with mean $\mu_\alpha$ and standard deviation $\sigma_\alpha$. The variation parameter $\beta$ is assumed to follow a standard normal distribution with mean $\mu_\beta$ and standard deviation $\sigma_\beta$. With these notations, the estimated leak yield distribution of the circuit-under-design is expressed as equation (2), where x is leak current and y is a probability for leak current of the circuit-under-design to be at most x.

$$y = F(x; \mu_\alpha, \sigma_\alpha, \mu_\beta, \sigma_\beta) \quad (2)$$

When there is an error between the estimated leak yield distribution and the actually measured yield distribution (hereinafter "measured leak yield distribution") in the statistical leak analysis, the error has to be corrected. To minimize the error, one approach is to correct the coefficients a, b, c, p, q, and r included in equation (1). However, the correction of the coefficients for each of millions to ten millions of cells in the circuit requires a huge amount of time and work.

In light of this, the design support method according to this embodiment focuses on two variation parameters $\alpha_i$ and $\beta$, and searches for values of the mean and the standard deviation of the variation parameters $\alpha_i$ and $\beta$ that minimizes the error. Further, the design support method recalculates estimated leak yield distribution of the circuit-under-design with the values of the mean and the standard deviation of the variation parameters $\alpha_i$ and $\beta$.

In FIG. 1, a graph 110 is the estimated leak yield distribution of the circuit-under-design. A graph 120 is the measured leak yield distribution that provides actually measured yields $y_1$, $y_2$, and $y_3$ for leak current $x_1$, $x_2$, and $x_3$. A square error function $G(\mu_\alpha, \sigma_\alpha, \mu_\beta, \sigma_\beta)$ that represents a square error for the estimated leak yield distribution and the measured leak yield distribution is expressed, for example, by equation (3).

$$G(\mu_\alpha, \sigma_\alpha, \mu_\beta, \sigma_\beta) = (F(x_1; \mu_\alpha, \sigma_\alpha, \mu_\beta, \sigma_\beta) - y_1)^2 + (F(x_2; \mu_\alpha, \sigma_\alpha, \mu_\beta, \sigma_\beta) - y_2)^2 + (F(x_3; \mu_\alpha, \sigma_\alpha, \mu_\beta, \sigma_\beta) - y_3)^2 \quad (3)$$

The design support method uses, for example, the least-square method and searches for $\mu_\alpha$, $\sigma_\alpha$, $\mu_\beta$, and $\sigma_\beta$ that minimize $G(\mu_\alpha, \sigma_\alpha, \mu_\beta, \sigma_\beta)$. With $\mu_\alpha$, $\sigma_\alpha$, $\mu_\beta$ and $\sigma_\beta$, leak current of each cell is expressed and the sum of the leak current is considered as leak current of the entire circuit to recalculate an estimated leak yield distribution.

As explained above, according to the design support method of the first embodiment, the accuracy of estimation of leak current of the circuit-under-design is improved. Further, compared to a situation where the coefficients are corrected, the design support method reduces time and load, thereby shortening the design period. In addition, since the variation parameters $\alpha_i$ and $\beta$ representing the variation factors are the target of the correction, even if a circuit-under-design is replaced with another circuit, similar advantages can be acquired so long as the process does not dramatically change.

Figure 2:
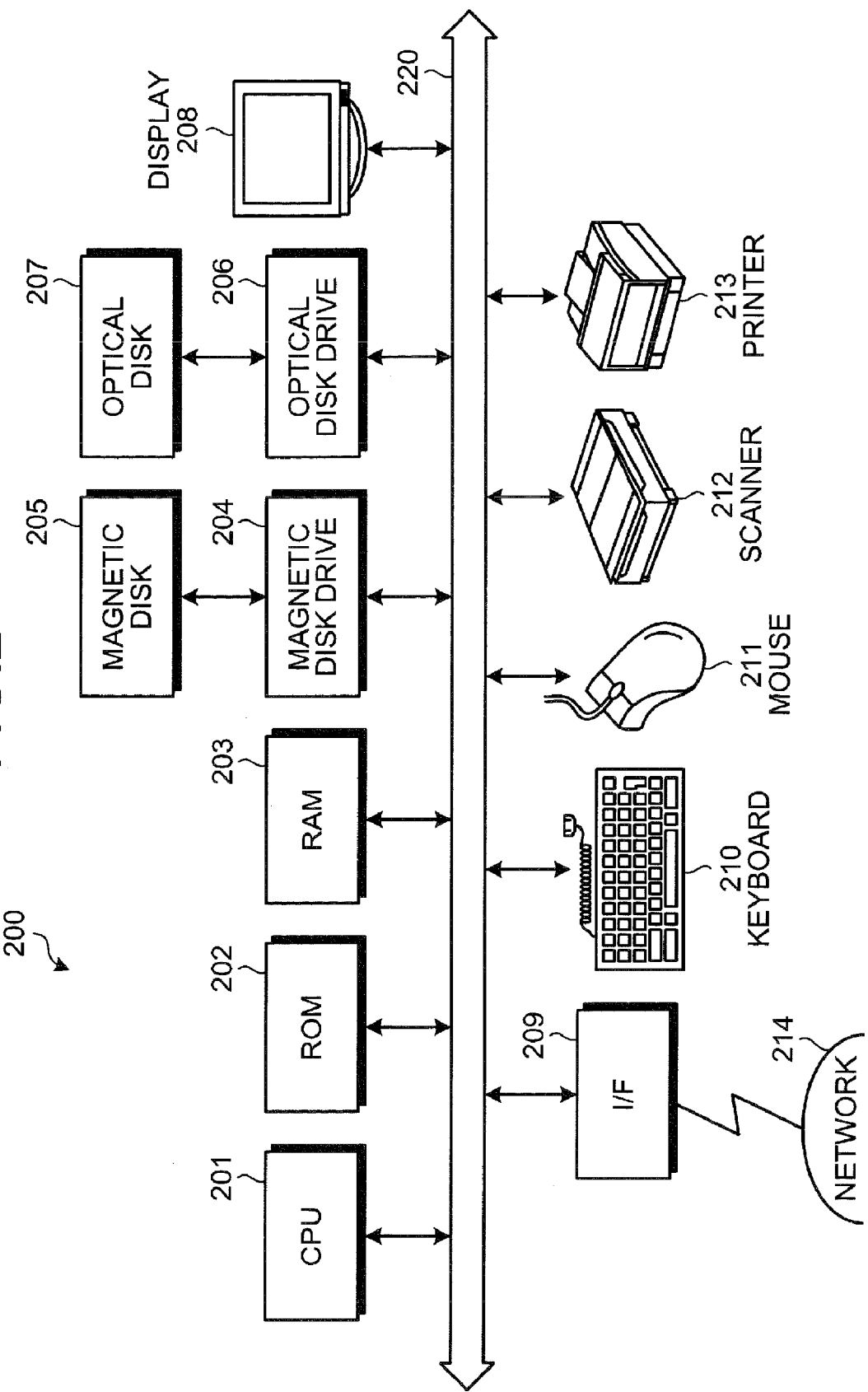
FIG. 2 is a diagram of a hardware configuration of the design support apparatus.

A design support apparatus 200 according to a second embodiment will be described. Description of parts identical to those of the first embodiment will be omitted. FIG. 2 is a diagram of a hardware configuration of the design support apparatus 200. As depicted in FIG. 2, the design support apparatus 200 includes a central processing unit (CPU) 201, a read-only memory (ROM) 202, a random access memory (RAM) 203, a magnetic disk drive 204, a magnetic disk 205, an optical disk drive 206, an optical disk 207, a display 208, an interface (I/F) 209, a keyboard 210, a mouse 211, a scanner 212, and a printer 213, respectively connected by way of a bus 220.

The CPU 201 governs overall control of the design support apparatus 200. The ROM 202 stores therein programs such as a boot program. The RAM 203 is used as a work area of the CPU 201. The magnetic disk drive 204, under the control of the CPU 201, controls the reading and writing of data with respect to the magnetic disk 205. The magnetic disk 205 stores therein the data written under control of the magnetic disk drive 204.

The optical disk drive 206, under the control of the CPU 201, controls the reading and writing of data with respect to the optical disk 207. The optical disk 207 stores therein the data written under control of the optical disk drive 206, the data being read by a computer.

The display 208 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 208.

The I/F 209 is connected to a network 214 such as the Internet through a communication line and is connected to other apparatuses through a network 214, such as a local area network (LAN), a wide area network (WAN), and the Internet. The I/F 209 administers an internal interface with the network 214 and controls the input/output of data from/to external apparatuses. For example, a modem or a LAN adaptor may be employed as the I/F 209.

The keyboard 210 includes, for example, keys for inputting letters, numerals, and various instructions and performs the input of data. Alternatively, a touch panel-type input pad or numeric keypad, etc. may be adopted. The mouse 211 performs the movement of the cursor, selection of a region, or movement and size change of windows. A track ball or a joy stick may be adopted provided each respectively has a function similar to a pointing device.

The scanner 212 optically reads an image and takes in the image data into the design support apparatus 200. The scanner 212 may have an optical character recognition (OCR) function as well. The printer 213 prints image data and text data. The printer 213 may be, for example, a laser printer or an ink jet printer.

A model data table 300 used by the design support apparatus 200 is stored in a storage device such as the RAM 203, the magnetic disk 205, and the optical disk 207 depicted in FIG. 2.

FIG. 3 is a diagram illustrating one example of the contents of a model data table. As depicted in FIG. 3, the model data table 300 includes fields of cell ID, coefficient a, coefficient b, coefficient c, coefficient p, coefficient q, and coefficient r. Information is set in the fields, and model data 300-1 through 300-$n$ for leak current of each cell $C_i$ are stored as records.

The cell ID is an identifier for a cell $C_i$ included in the circuit-under-design. The coefficients a, b, c, p, q, and r are a set of coefficients included in equation (1) expressing leak current of cell $C_i$. To specifically indicate coefficients for cell $C_i$, the coefficient set {a, b, c, p, q, r} may be expressed as {$a_i$, $b_i$, $c_i$, $p_i$, $q_i$, $r_i$}.

A measurement data table 400 of actually measured values is stored in a storage device such as the RAM 203, the magnetic disk 205, and the optical disk 207 depicted in FIG. 2.

Figure 4:
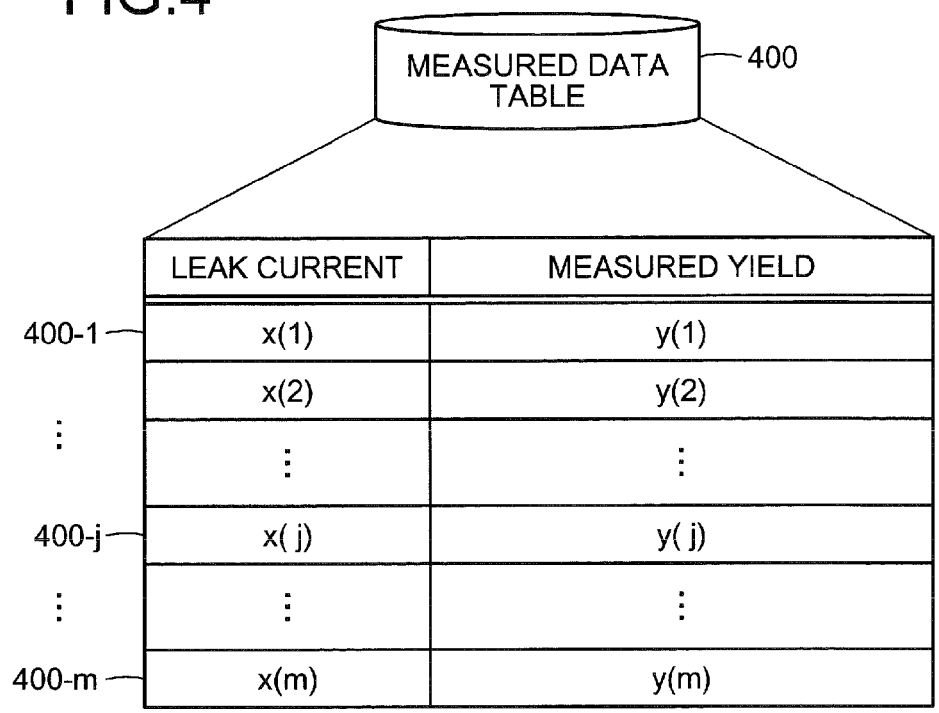
FIG. 4 is a diagram illustrating one example of the contents of a measurement data table.

FIG. 4 is a diagram illustrating one example of the contents of a measurement data table. A measurement data table 400 includes fields of leak current and measured yield. Information is set in the fields, and measurement data 400-1 through 400-m regarding leak current of the circuit-under-design are stored as records.

Leak current in the table indicates a dividing point in a yield distribution of leak current of the circuit-under-design. The measured yield is an actually measured yield concerning leak current of the circuit-under-design. As for measurement data 400-j, a probability for leak current of the circuit-under-design to be at most x(j) is y(j).

Figure 5:
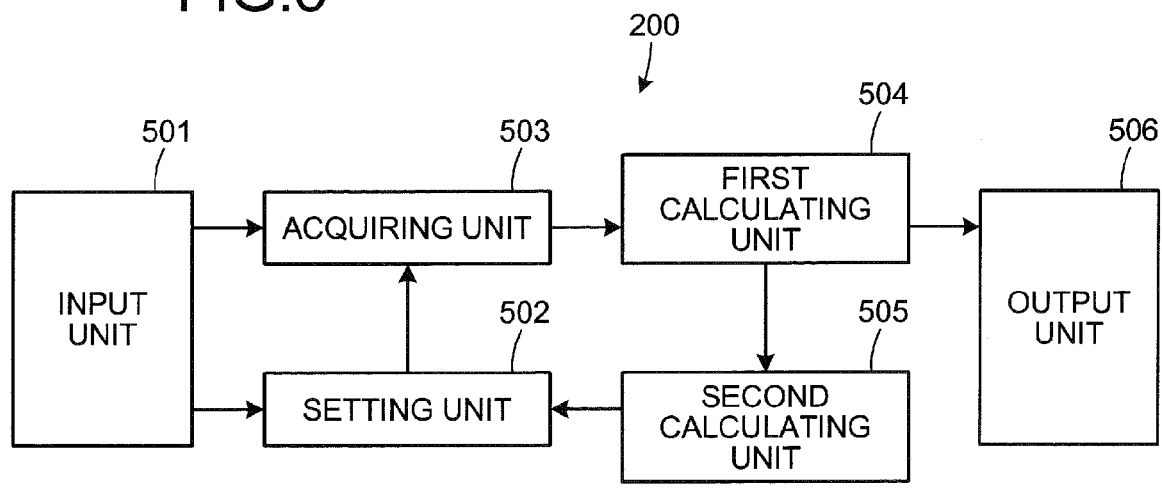
FIG. 5 is a functional diagram of the design support apparatus.

FIG. 5 is a functional diagram of the design support apparatus. In FIG. 5, the design support apparatus 200 includes an input unit 501, a setting unit 502, an acquiring unit 503, a first calculating unit 504, a second calculating unit 505, and an output unit 506. These units (the input unit 501 through the output unit 506) as a control unit are implemented by the I/F 209 or the CPU 201 executing a program stored in a storage device such as the ROM 202, RAM 203, the magnetic disk 205, and the optical disk 207 depicted in FIG. 2.

The input unit 501 receives an input of the measured leak yield distribution of the circuit-under-design. The measured leak yield distribution is a probability density distribution expressing an actually measured yield distribution regarding leak current of the circuit-under-design. The discretized measurement data 400-1 through 400-m depicted in FIG. 4 are examples of the measured leak yield distribution.

In the explanation below, a measured leak yield distribution expressing an actually measured yield distribution for leak current $x_j$ is called "measured leak yield distribution y(j)" (j=1, 2, ..., m). y(j) is a probability for leak current of the circuit-under-design to be at most $x_j$.

The input unit 501 receives an input of the measurement data 400-1 through 400-m, for example, by a user using the keyboard 210 or the mouse 211 depicted in FIG. 2. The input unit 501 may extract and acquire the measurement data 400-1 through 400-m from a database or a library (not depicted). The measurement data 400-1 through 400-m are stored, for example, in the measurement data table 400 depicted in FIG. 4.

The input unit 501 also receives model data for leak current of each cell $C_i$ of the circuit-under-design. The cell $C_i$ is, for example, a device such as a NOT circuit, an AND circuit, a NAND circuit, an OR circuit, and a NOR circuit included in the circuit-under-design. The model data is information to specify leak current of each cell $C_i$. The model data 300-1 through 300-n depicted in FIG. 3 are examples of the model data.

The input unit 501 receives an input of the model data 300-1 through 300-n, for example, by a user using the keyboard 210 or the mouse 211. The input unit 501 may extract and acquire the model data 300-1 through 300-n from a database or a library (not depicted). The input model data 300-1 through 300-n are stored in, for example, in the model data table 300 depicted in FIG. 3.

The setting unit 502 sets values for a normal distribution expressing variation components of leak current of the cell $C_i$. The variation components of leak current represent a variation factor (gate length, gate width, $V_{th}$, and so on) arising from the process. A normal distribution expressing a variation component is, for example, the variation parameter $\alpha_i$ or $\beta$ included in equation (1).

The variation parameter $\alpha_i$ is the normal distribution expressing a variation component unique to the cell $C_i$. The variation parameter $\beta$ is a normal distribution expressing a variation component common to all cells $C_1$ through $C_n$. The values for a normal distribution are values of mean, standard deviation, and variance that characterize the normal distribution; namely, the values for a normal distribution expressing variation components are, for example, "$\mu_\alpha, \mu_\mu$", the mean of the variation parameters $\alpha_i$ and $\beta$ of the cell $C_i$, and "$\sigma_\alpha, \sigma_\beta$", the standard deviation of the variation parameters $\alpha_i$ and $\beta$ of the cell $C_i$.

The setting unit 502 sets an initial value to a normal distribution expressing variation components, for example, before the execution of the second calculating unit 505 which is described later. After the execution of the second calculating unit 505, the setting unit 502 sets to the normal distribution, a value (hereinafter "calculated value") calculated by the second calculating unit 505. A result of the value setting is stored in a storage device such as the RAM 203, the magnetic disk 205, and the optical disk 207.

Initial values (for example, mean=0, standard deviation=1) for the normal distribution are designated beforehand and stored in a storage device such as the ROM 202, the RAM 203, the magnetic disk 205, and the optical disk 207. Alternatively, the input unit 501 may receive an input of the initial values by a user using the keyboard 210 or the mouse 211.

The acquiring unit 503 gives to a simulator the model data and the values for the normal distribution, and acquires leak current of the circuit-under-design. For example, the acquiring unit 503 provides the simulator with the model data 300-1 through 300-n, the mean "$\mu_\alpha, \mu_\beta$", and the standard deviation "$\sigma_\alpha, \sigma_\beta$", and performs a Monte Carlo simulation. The acquiring unit 503 acquires, from the simulator, leak current of the circuit-under-design as a simulation result.

The acquired leak current of the circuit-under-design is a discrete value, such as the leak current I(j) (j=1, 2, ..., m) corresponding to the number of iterations of the Monte Carlo simulation. The simulation result is stored in a storage device such as the RAM 203, the magnetic disk 205, and the optical disk 207.

The simulator may be equipped in the design support apparatus 200 or an external computer. If the simulator is equipped in an external computer, the acquiring unit 503 transmits the model data and the values for a normal distribution to the external computer, and acquires leak current of the circuit-under-design, a simulation result, from the external computer.

The first calculating unit 504 calculates, based on the acquired leak current of the circuit-under-design, the estimated leak yield distribution representing a yield distribution concerning leak current of the circuit-under-design. For example, the first calculating unit 504 calculates yield P(j) (j=1, 2, ..., m) for leak current I(j), using equation (4) below where m is the number of iterations of the Monte Carlo simulation.

$$P(j)=j/m \qquad (4)$$

The estimated leak yield distribution calculated according to equation (4) yields discrete values P(1), P(2), ..., P(m). A result of the calculation is stored in a storage device such as the RAM 203, the magnetic disk 205, and the optical disk 207.

The second calculating unit 505 calculates values for a normal distribution that minimizes error between y(j), the measured leak yield distribution, and the calculated estimated leak yield distribution. For example, the second calculating unit 505 calculates, according to the least-square method, "$\mu_\alpha, \mu_\beta$" (the mean of the variation parameters $\alpha_i$ and $\beta$) and "$\sigma_\alpha, \sigma_\beta$" (the standard deviation of the variation parameters $\alpha_i$ and $\beta$). The "$\mu_\alpha, \mu_\beta$" and "$\sigma_\alpha, \sigma_\beta$" minimize a function representing a square error between the measured leak yield distribution y(j) and the estimated leak yield distribution. In the explanation below, the function for a square error between the measured leak yield distribution y (j) and the estimated leak yield distribution is denoted by $G(\mu_\alpha, \sigma_\alpha, \mu_\beta, \sigma_\beta)$.

For example, the second calculating unit 505 calculates $\mu_\alpha$, $\sigma_\alpha$, $\mu_\beta$, $\sigma_\beta$ that minimize $G(\mu_\alpha, \sigma_\alpha, \mu_\beta, \sigma_\beta)$ based on the least-square method using the Nelder-Mead method. Alternatively, the second calculating unit 505 may calculate $\mu_\alpha$, $\sigma_\alpha$, $\mu_\beta$, $\sigma_\beta$ that minimize $G(\mu_\alpha, \sigma_\alpha, \mu_\beta, \sigma_\beta)$ based on the least-square method using a gradient method. A detailed explanation about operation of the second calculating unit 505 will be described later.

The output unit 506 outputs the calculated estimated leak yield distribution of the circuit-under-design. For example, the output unit 506 outputs the estimated leak yield distribution of the circuit-under-design (see FIG. 6) based on the leak current acquired from the simulator.

FIG. 6 is a diagram illustrating one example of the contents of an estimated data table. An estimated data table 600 includes fields of leak current and estimated yield. Information is set in the fields, and the estimated data 600-1 through 600-m concerning leak current of the circuit-under-design are stored as records.

Leak current in the table indicates a dividing point in a yield distribution concerning leak current of the circuit-under-design. The estimated yield in the table indicates an estimated yield concerning leak current of the circuit-under-design. As for the measurement data 600-j, a probability for leak current of the circuit-under-design to be at most I(j) is P(j).

The form of output is, for example, display on the display 208, printout from the printer 213, and transmission to an external device through the I/F 209. A result may be stored in a storage device such as the RAM 203, the magnetic disk 205, and the optical disk 207.

One example of operations of the second calculating unit 505 is explained. A least-square method using the Nelder-Mead method is used to calculate the mean and the standard deviation of the variation parameters $\alpha_i$ and $\beta$ to minimize $G(\mu_\alpha, \sigma_\alpha, \mu_\beta, \sigma_\beta)$.

In the explanation below, the estimated leak yield distribution of the circuit-under-design is denoted by $F(x(j); \mu_\alpha, \sigma_\alpha, \mu_\beta, \sigma_\beta)$ (j=1, 2, ..., m). With this notation, $G(\mu_\alpha, \sigma_\alpha, \mu_\beta, \sigma_\beta)$ is expressed as equation (5) below where y(j) is the measured leak yield distribution of the circuit-under-design.

$$G(\mu_\alpha, \sigma_\alpha, \mu_\beta, \sigma_\beta) = \sum_{j=1}^{m} \{F(x(j); \mu_\alpha, \sigma_\alpha, \mu_\beta, \sigma_\beta) - y(j)\}^2 \quad (5)$$

The second calculating unit 505 calculates $\mu_\alpha$, $\sigma_\alpha$, $\mu_\beta$, $\sigma_\beta$ that minimize $G(\mu_\alpha, \sigma_\alpha, \mu_\beta, \sigma_\beta)$ of equation (5), based on the least-square method using the Nelder-Mead method. When $F(x(j); \mu_\alpha, \sigma_\alpha, \mu_\beta, \sigma_\beta)$ is calculated by a direct simulation such as the Monte Carlo simulation, a result becomes a discrete value. Consequently, the derivative of $G(\mu_\alpha, \sigma_\alpha, \mu_\beta, \sigma_\beta)$ cannot be calculated.

In light of this problem, the Nelder-Mead method does not compute the derivative of $G(\mu_\alpha, \sigma_\alpha, \mu_\beta, \sigma_\beta)$ but searches for $\mu_\alpha, \sigma_\alpha, \mu_\beta, \sigma_\beta$ that minimize $G(\mu_\alpha, \sigma_\alpha, \mu_\beta, \sigma_\beta)$. In this explanation, $\mu_\alpha, \sigma_\alpha, \mu_\beta, \sigma_\beta$ are expressed in a vector form as equations (6) through (8).

$$p = (p_x, p_y, p_z, p_t) = (\mu_\alpha, \sigma_\alpha, \mu_\beta, \sigma_\beta) \quad (6)$$

$$G(p) = G(\mu_\alpha, \sigma_\alpha, \mu_\beta, \sigma_\beta) \quad (7)$$

$$F(x(j); p) = F(x(j); \mu_\alpha, \sigma_\alpha, \mu_\beta, \sigma_\beta) \quad (8)$$

The Nelder-Mead method is explained. The Nelder-Mead method repeats two operations, reflection and shrink, and searches for a simplex (for example, triangle) that encompasses a minimum point of an evaluation function G. Here, as an example, evaluation function G with two-dimensional arguments is minimized. Evaluation function G is the square error function G(p).

Figure 7:
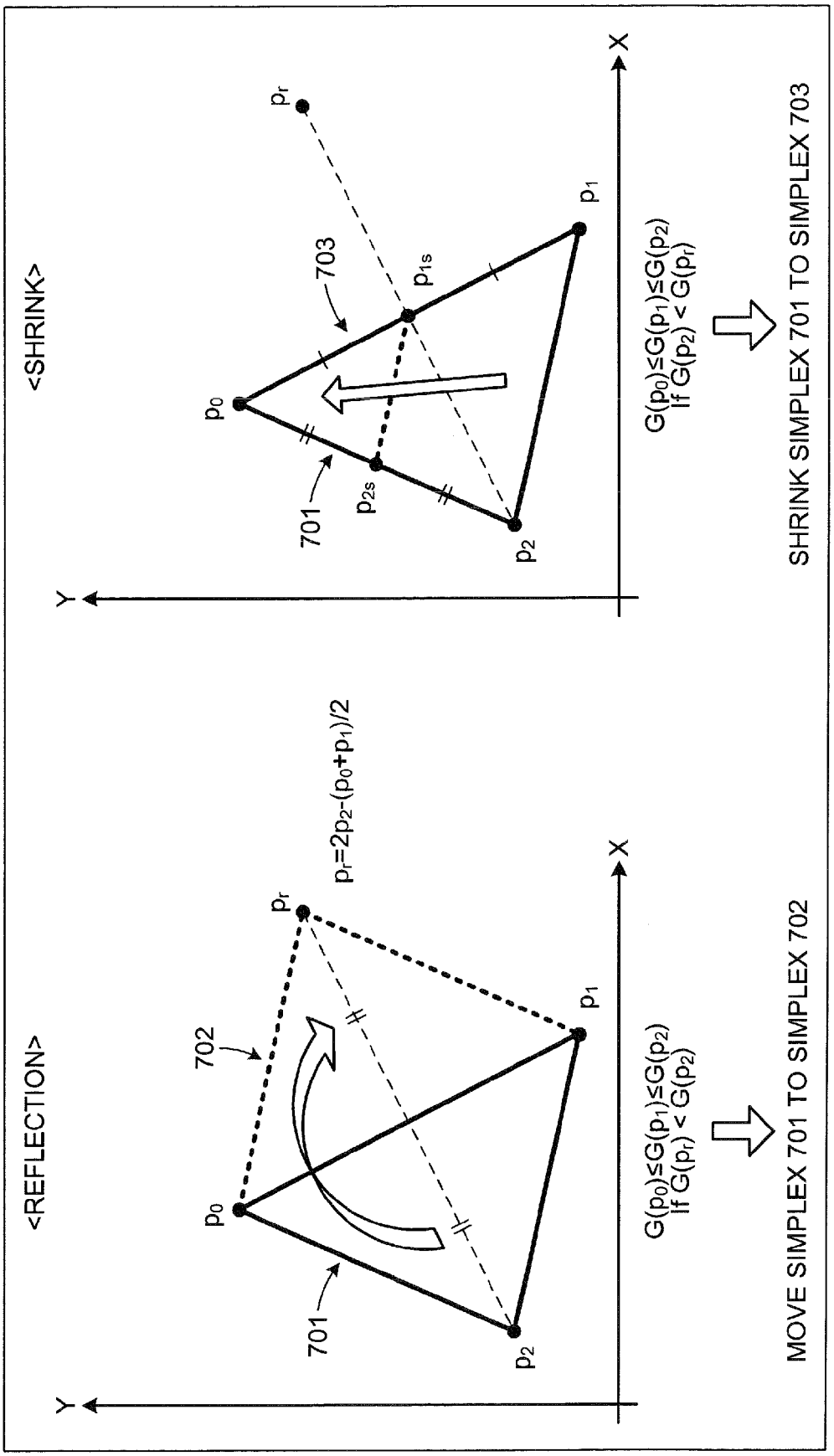
FIG. 7 is a diagram illustrating the Nelder-Mead method.

FIG. 7 is a diagram illustrating the Nelder-Mead method. In FIG. 7, three points $p_0$, $p_1$, $p_2$ are present on a two-dimensional plane made up of an X axis and an Y axis. It is assumed that when coordinate values of $p_0$, $p_1$, $p_2$ are given to evaluation function G, expression (9) holds.

$$G(p_0) \leq G(p_1) \leq G(p_2) \quad (9)$$

According to the Nelder-Mead method, point $p_2$, which maximizes G, is moved to the opposite side of a hyperplane that is defined by $p_0$ and $p_1$, keeping an area of the simplex (triangle) unchanged. Namely, point $p_2$ is moved to point $p_r$.

The coordinate values of $p_r$ is given to evaluation function G, and $G(p_r)$ is compared with $G(p_2)$. If $G(p_r)$ is smaller than $G(p_2)$, the reflection is performed. In other words, $p_2$ is moved to $p_r$, and a simplex 701 is moved to a simplex 702. According to the Nelder-Mead method, by the reflection, a simplex has approached a minimum point of evaluation function G.

If $G(p_r)$ is larger than $G(p_2)$, the shrink is performed. In other words, it is determined that even if the simplex 701 is moved to the simplex 702, the minimum point is not present within the simplex 702, and the reflection is not performed.

In this case, the minimum point of evaluation function G is searched for within the simplex 701. In other words, the simplex 701 is shrunk fixing $p_0$ which gives a lower value of evaluation function G. Here, the simplex 701 is shrunk into a simplex 703 made up of three points $p_0$, $p_{1s}$, and $p_{2s}$. According to the Nelder-Mead method, by the shrink, a region in which the minimum point of evaluation function G can be present has been narrowed down.

As explained above, the Nelder-Mead method repeats the reflection and the shrink operations to search for the minimum point of evaluation function G. The reflection and the shrink operations are repeated a given number of times (for example, a hundred thousand times) or until a simplex converges.

A calculation method for evaluation function G(p) is explained. Evaluation function G(p) is expressed as equation (10) below from equations (5), (7), and (8).

$$G(p) = \sum_{j=1}^{m} \{F(x(j); p) - y(j)\}^2 \quad (10)$$

To acquire evaluation function G(p), F(x(j); p) is calculated. For example, the second calculating unit 505 provides the simulator with the model data 300-1 through 300-n and the mean and the standard deviation of the variation parameters $\alpha_i$ and $\beta$, executing the Monte Carlo simulation. In this way, yield $P_1, P_2, \ldots, P_m$ for leak current $I_1, I_2, \ldots, I_m$ are acquired. F(x(j); p) is calculated according to Condition 1 through Condition 3.

(Condition 1) If $x(j) < I_1$, $$F(x(j); p) = 0$$

(Condition 2) If $I_1 < x(j) \leq I_m$, with k such that $I_k \leq x(j) < I_{k+1}$, $$F(x(j); p) = (P_{k+1} - P_k) \times (x(j) - I_k) / (I_{k+1} - I_k) + P_k$$

(Condition 3) If $I_m \leq x(j)$, $$F(x(j); p) = 1$$

Calculated F(x(j); p) and measured leak yield distribution y(j) are substituted into equation (10), obtaining evaluation function G(p).

According to the second embodiment, the least-square method using the Nelder-Mead method is applied to evaluation function G(p) having a four-dimensional argument ($\mu_\alpha$, $\sigma_\alpha$, $\mu_\beta$, $\sigma_\beta$). Calculation of the mean and the standard deviation using the Nelder-Mead method will be explained with reference to a flowchart in FIG. 10.

Next, according to the least-square method using a gradient method, the mean and the standard deviation of the variation parameters $\alpha_i$ and $\beta$ that minimize G($\mu_\alpha$, $\sigma_\alpha$, $\mu_\beta$, $\sigma_\beta$) are calculated. The gradient method is a method that searches for a stationary point $x_0$ such that $\nabla G(x_0)=0$ when the gradient $\nabla G$ of evaluation function G is computable.

Estimated leak yield distribution F(x(j); $\mu_\alpha$, $\sigma_\alpha$, $\mu_\beta$, $\sigma_\beta$) of the circuit-under-design is modeled with a known distribution. Consequently, evaluation function G($\mu_\alpha$, $\sigma_\alpha$, $\mu_\beta$, $\sigma_\beta$) becomes differentiable so that $\mu_\alpha$, $\sigma_\alpha$, $\mu_\beta$, $\sigma_\beta$ minimizing G($\mu_\alpha$, $\sigma_\alpha$, $\mu_\beta$, $\sigma_\beta$) can be searched for.

The gradient of G($\mu_\alpha$, $\sigma_\alpha$, $\mu_\beta$, $\sigma_\beta$) is written as equation (11) below. The gradient of F(x(j); $\mu_\alpha$, $\sigma_\alpha$, $\mu_\beta$, $\sigma_\beta$) is expressed as equation (12) below.

$$\nabla G(\mu_\alpha, \sigma_\alpha, \mu_\beta, \sigma_\beta) = \qquad (11)$$
$$\sum_{j=1}^{m} 2(F(x(j); \mu_\alpha, \sigma_\alpha, \mu_\beta, \sigma_\beta) - y(j)) \times \nabla F(x(j); \mu_\alpha, \sigma_\alpha, \mu_\beta, \sigma_\beta)$$

$$\nabla F = (\partial F/\partial \mu_\alpha, \partial F/\partial \sigma_\alpha, \partial F/\partial \mu_\beta, \partial F/\partial \sigma_\beta) \qquad (12)$$

Estimated leak yield distribution F(x(j); $\mu_\alpha$, $\sigma_\alpha$, $\mu_\beta$, $\sigma_\beta$) is also modeled with a normal distribution to express leak current of the cell $C_i$ by equation (13) below. Equation (13) is a simplified form of equation (1). Further, M and $S^2$ are defined by equations (14) and (15) below.

$$E_i = \exp(a + b \times \alpha_i + c \times \beta) \qquad (13)$$

$$M = \Sigma_j \exp\{a_j + b_j \times \mu_\alpha + c_j \times \mu_\beta + (b_j \times \sigma_\alpha)^2/2 + (c_j \times \sigma_\beta)^2/2\} \qquad (14)$$

$$S^2 = \Sigma_j \exp\{2a_j + 2b_j \times \mu_\alpha + 2c_j \times \mu_\beta + 2(b_j \times \sigma_\alpha)^2 + 2(c_j \times \sigma_\beta)^2\} + \Sigma_{j,i} \exp\{a_j + a_i + (b_j + b_i) \times \mu_\alpha + (c_j + c_i) \times \mu_\beta + \{(b_j \times \sigma_\alpha)^2 + (b_i \times \sigma_\alpha)^2 + (c_j \times \sigma_\beta + c_i \times \sigma_\beta)^2\}/2\} \qquad (15)$$

With M and $S^2$ of equations (14) and (15), the estimated leak yield distribution F(x (j); $\mu_\alpha$, $\sigma_\alpha$, $\mu_\beta$, $\sigma_\beta$) is approximated in fractions of polynomial of x (j) as equation (16) below.

$$F(x(j); \mu_\alpha, \sigma_\alpha, \mu_\beta, \sigma_\beta) = (1/S\sqrt{2\pi}) \int_{-\infty}^{x(j)} \exp(-(t-M)^2/2S^2) dt \qquad (16)$$

Partial derivatives of F(x(j); $\mu_\alpha$, $\sigma_\alpha$, $\mu_\beta$, $\sigma_\beta$) of equation (16) with respect to each of $\mu_\alpha$, $\sigma_\alpha$, $\mu_\beta$, $\sigma_\beta$ is acquired as equations (17) through (20) below. Partial derivatives $\partial M/\partial \mu_\alpha$, $\partial M/\partial \mu_\beta$, $\partial S/\partial \sigma_\beta$, $\partial M/\partial Y_\alpha$, $\partial M/\partial \sigma_\beta$, $\partial S/\partial \mu_\alpha$, and $\partial S/\partial \mu_\beta$ in these equations can be acquired from differentiation of equations (14) and (15).

$$(\partial F/\partial \mu_\alpha)(x(j); \mu_\alpha, \sigma_\alpha, \mu_\beta, \sigma_\beta) = -(1/S\sqrt{2\pi}) \times \exp(-)x(j) - M)^2/2S^2) \times (\partial M/\partial \mu_\alpha) - ((x(j)-M)/S^2\sqrt{2\pi}) \times \exp(-(x(j)-M)^2/2S^2) \times (\partial S/\partial \mu_\alpha) \qquad (17)$$

$$(\partial F/\partial \mu_\alpha)(x(j); \mu_\alpha, \sigma_\alpha, \mu_\beta, \sigma_\beta) = -(1/S\sqrt{2\pi}) \times \exp(-)x(j) - M)^2/2S^2) \times (\partial M/\partial \mu_\alpha) - ((x(j)-M)/S^2\sqrt{2\pi}) \times \exp(-(x(j)-M)^2/2S^2) \times (\partial S/\partial \mu_\alpha) \qquad (17)$$

$$(\partial F/\partial \mu_\alpha)(x(j); \mu_\alpha, \sigma_\alpha, \mu_\beta, \sigma_\beta) = -(1/S\sqrt{2\pi}) \times \exp(-)x(j) - M)^2/2S^2) \times (\partial M/\partial \mu_\alpha) - ((x(j)-M)/S^2\sqrt{2\pi}) \times \exp(-(x(j)-M)^2/2S^2) \times (\partial S/\partial \mu_\alpha) \qquad (18)$$

$$(\partial F/\partial \mu_\beta)(x(j); \mu_\alpha, \sigma_\alpha, \mu_\beta, \sigma_\beta) = -(1/S\sqrt{2\pi}) \times \exp(-)x(j) - M)^2/2S^2) \times (\partial M/\partial \mu_\beta) - ((x(j)-M)/S^2\sqrt{2\pi}) \times \exp(-(x(j)-M)^2/2S^2) \times (\partial S/\partial \mu_\beta) \qquad (19)$$

$$(\partial F/\partial \mu_\beta)(x(j); \mu_\alpha, \sigma_\alpha, \mu_\beta, \sigma_\beta) = -(1/S\sqrt{2\pi}) \times \exp(-)x(j) - M)^2/2S^2) \times (\partial M/\partial \mu_\beta) - ((x(j)-M)/S^2\sqrt{2\pi}) \times \exp(-(x(j)-M)^2/2S^2) \times (\partial S/\partial \mu_\beta) \qquad (19)$$

According to the least-square method using the gradient descent method, a search is performed in a direction that evaluation function G($\mu_\alpha$, $\sigma_\alpha$, $\mu_\beta$, $\sigma_\beta$) decreases. As a result, compared with the Nelder-Mead method, evaluation function G converges with fewer iterations and in a shorter time. Calculation of the mean and the standard deviation will be explained with reference to a flowchart in FIG. 11.

Figure 8:
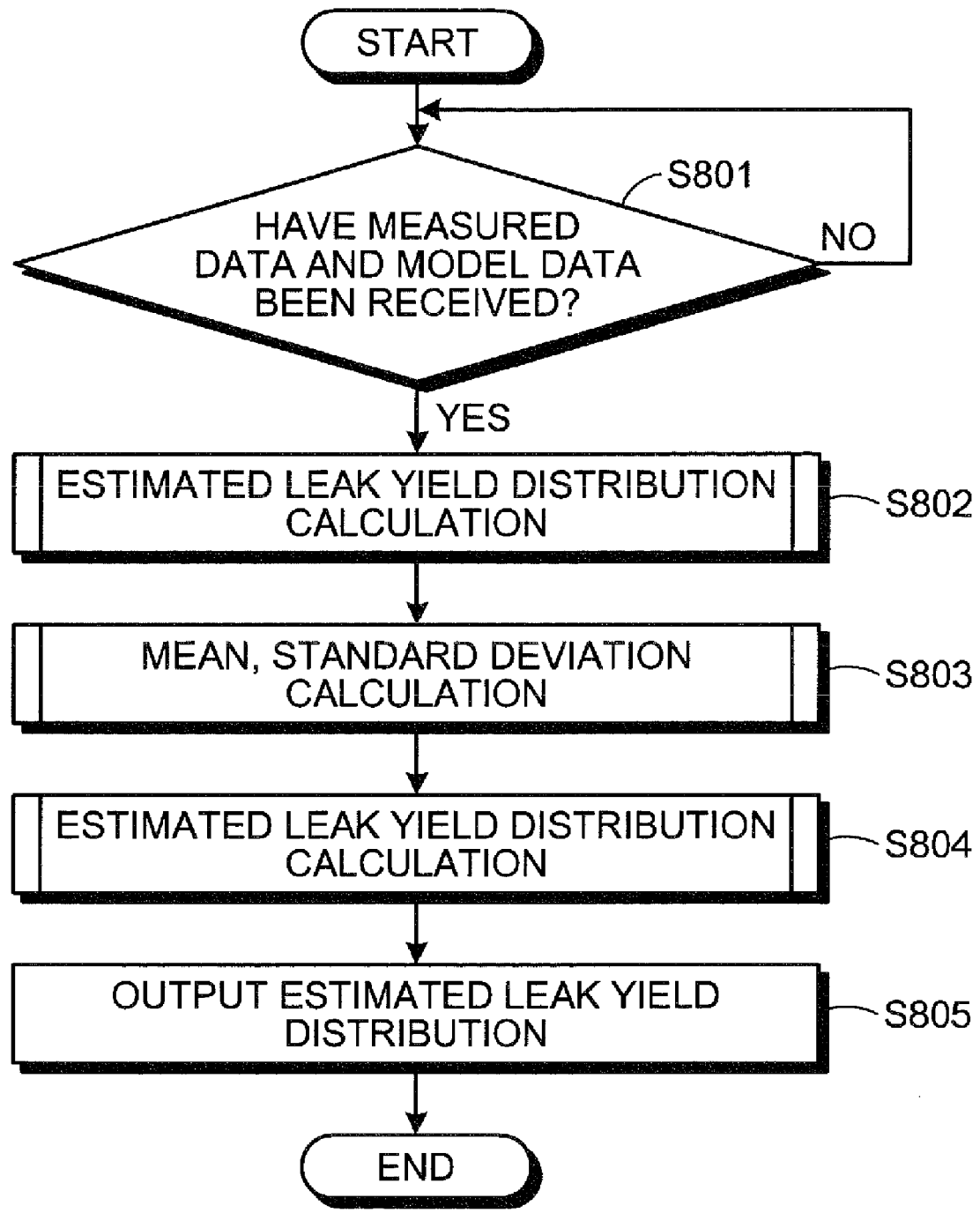
FIG. 8 is a flowchart illustrating one example of a support process.

An operation of the design support apparatus 200 is explained. FIG. 8 is a flowchart illustrating one example of a support process. As depicted in the flowchart in FIG. 8, it is determined whether the input unit 501 has received the measurement data 400-1 through 400-m and the model data 300-1 through 300-n (step S801).

The input unit 501 waits until the measurement data 400-1 through 400-m and the model data 300-1 through 300-n are input (step S801: NO). When the measurement data and the model data are input (step S801: YES), the first calculating unit 504 calculates an estimated leak yield distribution (step S802). The second calculating unit 505 calculates the mean and the standard deviation (step S803).

The first calculating unit 504 calculates an estimated leak yield distribution (step S804). The output unit 506 outputs the estimated leak yield distribution calculated at step S804 (step S805) and the process ends.

Figure 9:
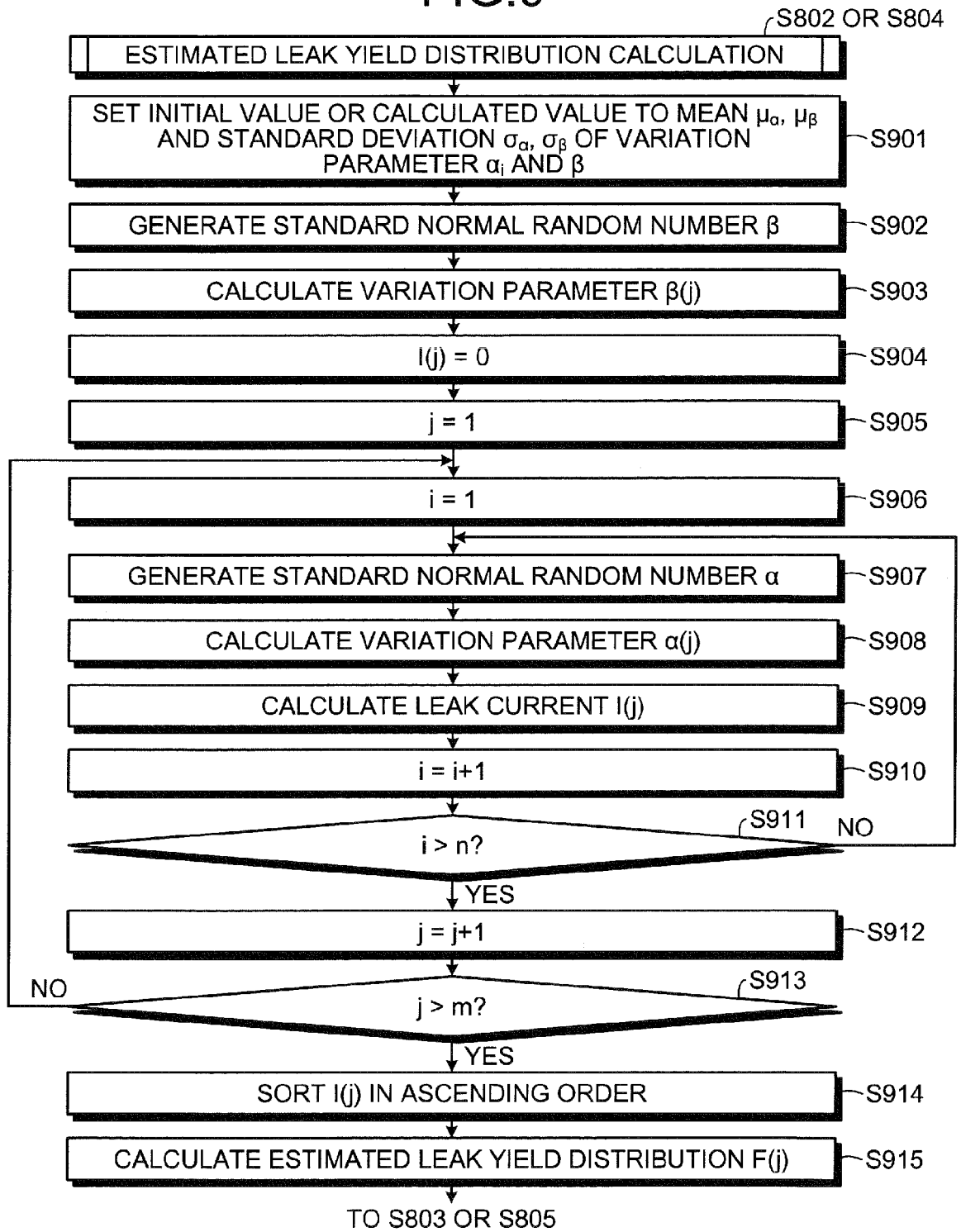
FIG. 9 is a flowchart illustrating one example of the estimated leak yield distribution calculation.

A process of the estimated leak yield distribution calculation at step S802 or S804 in FIG. 8 is explained. FIG. 9 is a flowchart illustrating one example of the estimated leak yield distribution calculation.

As depicted in the flowchart in FIG. 9, the setting unit 502 sets initial values or calculated values in the mean $\mu_\alpha$, $\mu_\beta$ and the standard deviation $\sigma_\alpha$, $\sigma_\beta$ of the variation parameters $\alpha_i$ and $\beta$ (step S901). The calculated values are the values of the mean and the standard deviation calculated at step S803 depicted in FIG. 8.

Before the calculation of the mean and the standard deviation at step S803, the setting unit 502 sets the initial values (the estimated leak yield distribution calculation at step S802). On the other hand, after step S803, the setting unit 502 sets the calculated value (the estimated leak yield distribution calculation at step S804).

The acquiring unit 503 generates a normal random number β (step S902), substitutes the initial values or the calculated values set in step S901 into equation (21) below to calculate a variation parameter β(j) (step S903).

$$\beta(j) = \sigma_\beta \times \beta + \mu_\beta \qquad (21)$$

The acquiring unit 503 initializes leak current I(j) of the circuit-under-design such that I(j)=0 (step S904), and sets j such that j=1 (step S905). The acquiring unit 503 sets i such that i=1 (step S906) and generates a normal random number a (step S907). The acquiring unit 503 substitutes the initial values or the calculated values set at step S901 into equation (22) below and calculates a variation parameter α(j) (step S908).

$$\alpha(j) = \sigma_\alpha \times \alpha + \mu_\alpha \qquad (22)$$

The acquiring unit 503 substitutes the model data 300-i and the variation parameters α(j) and β(j) into equation (23) below and calculates leak current I(j) of the circuit-under-design (step S909).

$$I(j)=I(j)+\exp(a_i+b_i\times\alpha(j)+c_i\times\beta(j)+p_i\times\alpha(j)^2+q_i\times\alpha(j)\times\beta(j)+r_i\times\beta(j)^2) \quad (23)$$

The acquiring unit 503 increments i (step S910) and determines if i>n (step S911). If i≦n (step S911: NO), the process returns to step S907. If i>n (step S911: YES), the acquiring unit 503 increments j (step S912).

The acquiring unit 503 determines if j>m (step S913). If j≦m (step S913: NO), the process returns to step S906. If j>m (step S913: YES), the acquiring unit 503 sorts I(j) calculated at step S909, in ascending order (step S914).

The first calculating unit 504 substitutes the sorted leak current I(j) into equation (24) below and calculates estimated leak yield distribution F(j) of the circuit-under-design (step S915). The process proceeds to step S803 or 5805 depicted in FIG. 8.

$$F(j)=j/m, \text{ where } (j=1, 2, \ldots, m) \quad (24)$$

In this way, leak current I(j) of the circuit-under-design is estimated taking into account a variation component unique to each cell $C_i$ and a variation component common to all cells $C_1$ through $C_n$. As a result, estimated leak yield distribution F(j) concerning leak current I(j) of the circuit-under-design is estimated accurately.

The calculation of mean and standard deviation in step S803 of FIG. 8 is explained in detail. $\mu_\alpha$, $\sigma_\alpha$, $\mu_\beta$, $\sigma_\beta$ that minimize $G(\mu_\alpha, \sigma_\alpha, \mu_\beta, \sigma_\beta)$ are calculated according to the least-square method using the Nelder-Mead method.

Figure 10:
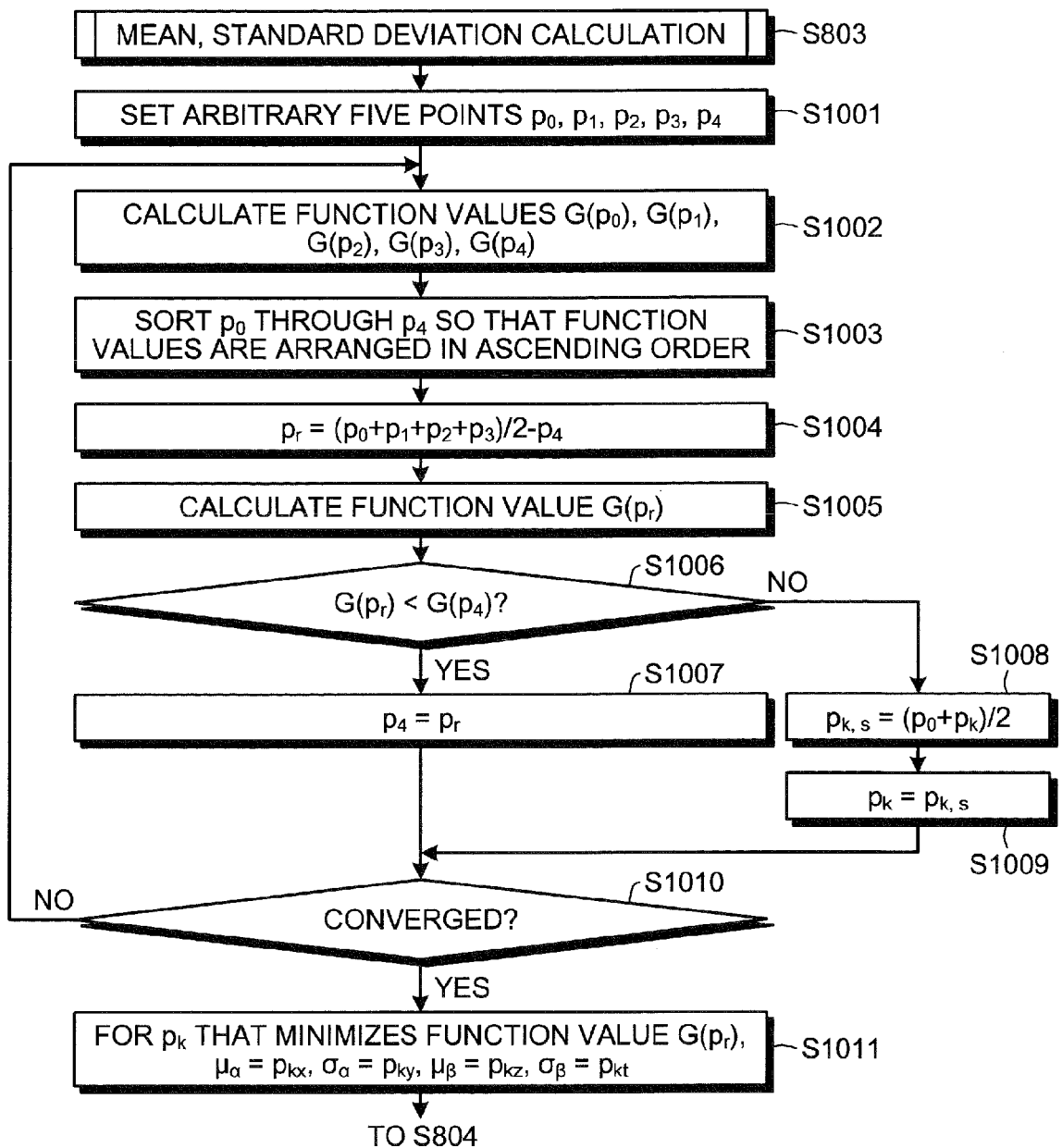
FIG. 10 is a flowchart illustrating one example of the calculation of mean and standard deviation using the Nelder-Mead method.

FIG. 10 is a flowchart illustrating one example of the calculation of mean and standard deviation using the Nelder-Mead method. As depicted in the flowchart in FIG. 10, the second calculating unit 505 selects five points $p_c$, $p_1$, $p_2$, $p_3$, and $p_4$ in the four dimensional space as initial values (step S1001). In other words, the second calculating unit 505 sets minimal points for forming a simplex in the four dimensional space.

The second calculating unit 505 provides G(p) with coordinate values of $p_0$, $p_1$, $p_2$, $p_3$, and $p_4$ and calculates function values $G(p_0)$, $G(p_1)$, $G(p_2)$, $G(p_3)$, and $G(p_4)$ (step S1002). Regarding calculation of G(p), see equation (10).

The second calculating unit 505 sorts points $P_0$, $p_1$, $p_2$, $p_3$, $p_4$ such that the function values $G(p_0)$, $G(p_1)$, $G(p_2)$, $G(p_3)$, and $G(p_4)$ are arranged in ascending order (step S1003). The second calculating unit 505 defines $p_r$ where $p_r=(p_0+p_1+p_2+p_3)/2-p_4$ (step S1004) and calculates a function value $G(p_r)$ (step S1005).

The second calculating unit 505 determines whether $G(p_r)<G(p_4)$ (step S1006). If $G(p_r)<G(p_4)$ (step S1006: YES), $P_4$ is replaced with $p_r$; namely $p_4=p_r$ (step S1007). If $G(p_r)≧G(p_4)$ (step S1006: NO). $p_{k,s}$ is defined as $p_{k,s}=(p_0+p_k)/2$ (step S1008) and $p_k$ is replaced with $p_{k,s}$; namely, $p_k=p_{k,s}$ (step S1009) where k=1, 2, 3, 4.

The second calculating unit 505 determines whether the simplex has converged (step S1010). If the simplex has not converged (step S1010: NO), the process returns to step S1002. If the simplex has converged (step S1010: YES), for $p_k$ that minimizes $G(p_k)$, $\mu_\alpha=p_{kx}$, $\sigma_\alpha=p_{ky}$, $\mu_\beta=p_{kz}$, $\sigma_\beta=p_{kt}$ (step S1011). The process proceeds to step S804 of FIG. 8.

The convergence of the simplex may be determined, for example, when the sum of distances between the points is less than a give value, which indicates that five points $p_0$, $p_1$, $p_2$, $p_3$, $p_4$ are sufficiently close each other. When the number of executions in steps S1007 and S1009 exceeds a given number of times (for example, a hundred thousand times), it may be determined that the simplex has converged.

In this way, without derivatives of the square error function, the mean and the standard deviation of the variation parameters $\alpha_i$ and $\beta$ that minimizes the square error function can be acquired.

Figure 11:
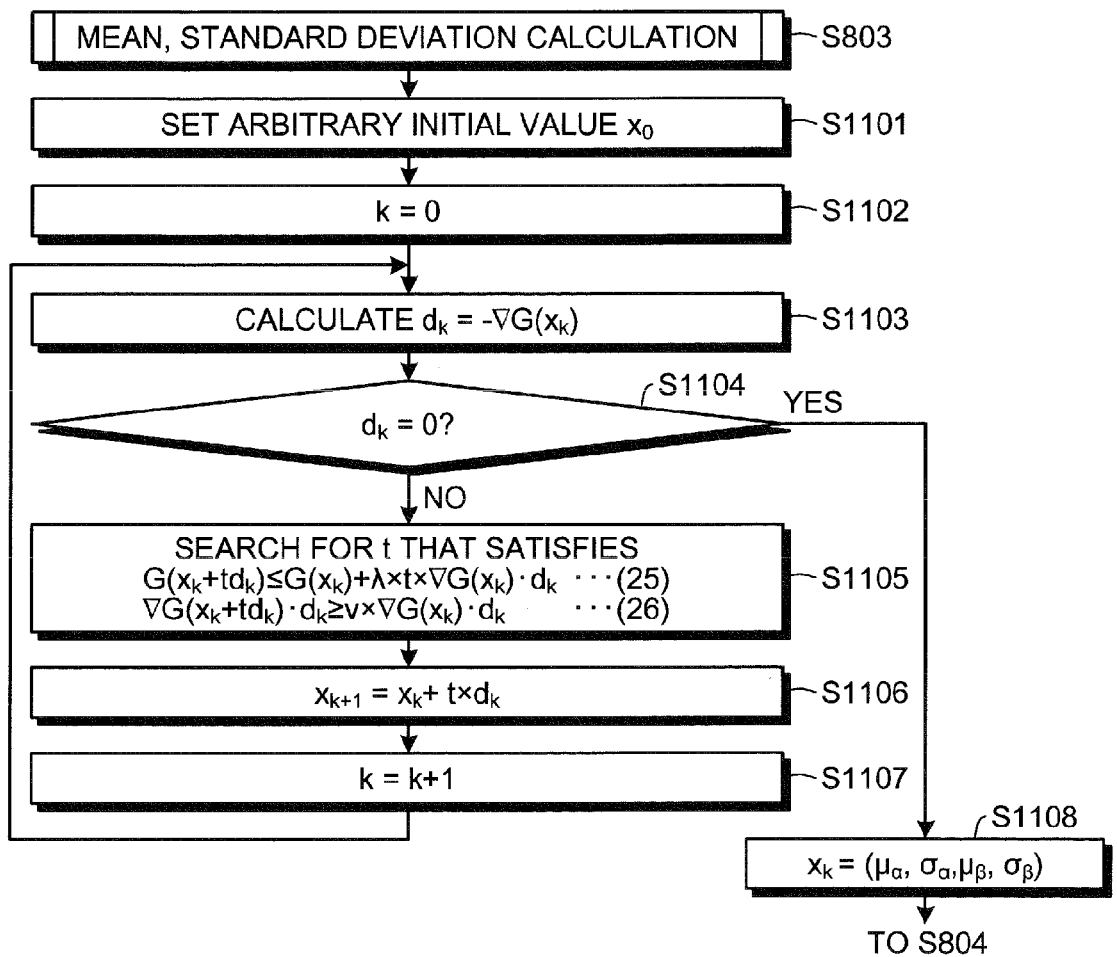
FIG. 11 is a flowchart illustrating one example of the calculation of mean and standard deviation using the gradient method.

The calculation of $\mu_\alpha$, $\sigma_\alpha$, $\mu_\beta$, $\sigma_\beta$ that minimize $G(\mu_\alpha, \sigma_\alpha, \mu_\beta, \sigma_\beta)$ according to the least-square method using the gradient method is explained. FIG. 11 is a flowchart illustrating one example of the calculation of mean and standard deviation using the gradient method. As depicted in the flowchart in FIG. 11, the second calculating unit 505 sets $x_o$, an arbitrary initial value (step S1101).

The second calculating unit 505 sets k such that k=0 (step S1102) and calculates $d_k=-\nabla G(x_k)$ (step S1103). The second calculating unit 505 determines whether $d_k=0$ (step S1104).

If $d_k\neq 0$ (step S1104: NO), the second calculating unit 505 searches for t that satisfies inequalities (25) and (26) below (step S1105) where t>0, 0<λ<0.5, and λ<v<1, λ and v being constants.

$$G(x_k+td_k) \leq G(x_k) + \lambda \times t \times \nabla G(x_k) \cdot d_k \quad (25)$$

$$\nabla G(x_k+td_k) \cdot d_k \geq v \times \nabla G(x_k) \cdot d_k \quad (26)$$

The second calculating unit 505 sets $x_{k+1}$ such that $x_{k+1}=x_k+t\times d_k$ (step S1106) and increments k (step S1107). The process returns to step S1103. If $d_k=0$ at step S1104 (step S1104: YES), the second calculating unit 505 sets $x_k$ such that $x_k=(\mu_\alpha, \sigma_\alpha, \mu_\beta, \sigma_\beta)$ (step S1108). The process proceeds to step S804 of FIG. 8.

When $G(x_k+td_k)$ is expressed as g(t) in inequalities (25) and (26), the search conditions for t in step S1105 become inequalities (27) and (28).

$$g(t) \leq g(0) + \lambda \times t \times g'(0) \quad (27)$$

$$g'(t) \geq vg'(0) \quad (28)$$

Figure 12:
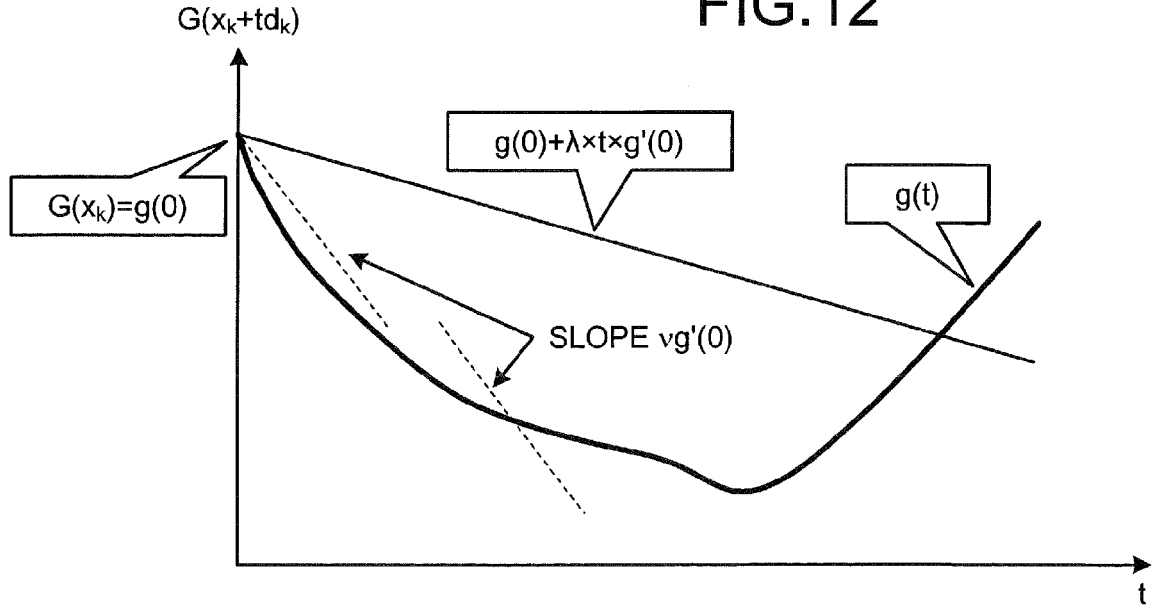
FIG. 12 is a depicting search conditions for t.

Inequality (27) is a condition for t to satisfy $G(x_k+td_k)<G(x_k)$ (see FIG. 12). Inequality (28) is a condition for $G(x_k+td_k)$ to become as small as possible (moderate incline) (see FIG. 12).

In this way, compared to the Nelder-Mead method, the time for calculation of the mean and the standard deviation of the variation parameters $\alpha_i$ and $\beta$ is shortened.

As set forth above, according to the embodiments, values for a normal distribution expressing variation components of leak current are acquired minimizing error between the measured leak yield distribution and the estimated leak yield distribution. Further, according to the embodiments, the estimated leak yield distribution of the circuit-under-design is calculated with calculated values for a normal distribution, thereby improving the accuracy of estimation.

Furthermore, according to the embodiments, using the least-square method using the Nelder-Mead method, values for a normal distribution that minimize error between the measured leak yield distribution and the estimated leak yield distribution are calculated. In other words, without calculation of derivatives of the square error function that expresses a square error between the measured leak yield distribution and the estimated leak yield distribution, values for a normal distribution that minimize the square error function can be calculated.

Furthermore, values for a normal distribution that minimize error between an actually measured yield distribution and an estimated yield distribution are calculated with the least-square method using a gradient method. Compared to the Nelder-Mead method, the time for calculating the values for a normal distribution is shortened.

Furthermore, variation components of leak current of a cell is expressed with variation parameters $\alpha_i$ and $\beta$. Consequently, leak current of the circuit-under-design is estimated considering a variation component unique to each cell $C_i$ and a variation component common to all cells $C_1$ through $C_n$. As a result, a yield distribution concerning leak current of the circuit-under-design is accurately estimated.

The method explained in the present embodiments can be implemented by a computer, such as a personal computer and a workstation, executing a program that is prepared in advance. The program is recorded on a computer-readable recording medium such as a hard disk, a flexible disk, a CD-ROM, an MO, and a DVD, and is executed by being read out from the recording medium by a computer. The program can be distributed through a network such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A computer-readable recording medium storing therein a program causing a computer that accesses a simulator to execute:
    receiving a measured yield distribution that expresses an actually measured yield distribution concerning leak current of a circuit-under-design, and model data for leak current of a cell of the circuit-under-design;
    providing the simulator with the model data and values for a normal distribution concerning variation components of the leak current of the cell;
    acquiring the leak current of the circuit-under-design;
    calculating, based on the leak current acquired at the acquiring, an estimated yield distribution that is a yield distribution concerning the leak current of the circuit-under-design;
    calculating values for the normal distribution that minimize error between the measured yield distribution and the estimated yield distribution;
    setting an initial value to the normal distribution and the calculated values for the normal distribution to the normal distribution; and
    outputting the estimated yield distribution that is based on the leak current of the circuit-under-design.

2. The computer-readable recording medium according to claim 1, wherein at the calculating of values for the normal distribution, the Nelder-Mead method is used.

3. The computer-readable recording medium according to claim 1, wherein at the calculating of values for the normal distribution, a gradient method is used.

4. The computer-readable recording medium according to claim 1, wherein the normal distribution includes a first normal distribution expressing a variation component unique to a cell and a second normal distribution expressing a variation component common to all cells in the circuit-under-design, and the values for the normal distribution are values of mean and standard deviation of the first and the second normal distributions.

5. A design support apparatus comprising:
    an input unit configured to receive a measured yield distribution that expresses an actually measured yield distribution concerning leak current of a circuit-under-design, and model data for leak current of a cell of the circuit-under-design;
    an acquiring unit configured to provide the simulator with the model data and values for a normal distribution concerning variation components of the leak current of the cell, and to acquire the leak current of the circuit-under-test;
    a first calculating unit configured to calculate, based on the acquired leak current, an estimated yield distribution that is a yield distribution concerning the leak current of the circuit-under-design;
    a second calculating unit configured to calculate values for the normal distribution that minimize error between the measured yield distribution and the estimated yield distribution;
    a setting unit configured to set an initial value to the normal distribution and the calculated values for the normal distribution to the normal distribution; and
    an output unit configured to output the estimated yield distribution that is based on the leak current of the circuit-under-design.

6. A design support method for a computer that includes a control unit and a storage unit and accesses a simulator, the method comprising:
    receiving and storing in the storage unit, by the control unit, a measured yield distribution that expresses an actually measured yield distribution concerning leak current of a circuit-under-design, and model data for leak current of a cell of the circuit-under-design;
    setting an initial value to a normal distribution concerning variation components of the leak current of the cell and storing a result of the setting in the storage unit, by the control unit;
    providing, by the control unit, the simulator with the model data and the initial value;
    acquiring and storing in the storage unit, by the control unit, first leak current of the circuit-under-design;
    calculating and storing in the storage unit, by the control unit, a first estimated yield distribution based on the first leak current of the circuit-under-design;
    calculating and storing in the storage unit, by the control unit, values for the normal distribution that minimize error between the measured yield distribution and the first estimated yield distribution;
    setting the calculated values to the normal distribution and storing a result of the setting in the storage unit, by the control unit;
    providing, by the control unit, the simulator with the model data and the calculated values set at the setting;
    acquiring and storing in the storage unit, by the control unit, second leak current of the circuit-under-design;
    calculating and storing in the storage unit, by the control unit, a second estimated yield distribution that is based on the second leak current of the circuit-under-design; and
    outputting, by the control unit, the second estimated yield distribution.

* * * * *